United States Patent [19]
Confalonieri et al.

[11] Patent Number: 5,638,330
[45] Date of Patent: Jun. 10, 1997

[54] LOW DISSIPATION INITIALIZATION CIRCUIT, PARTICULARLY FOR MEMORY REGISTERS

[75] Inventors: Pierangelo Confalonieri, Bergamo; Germano Nicollini, Piacenza, both of Italy

[73] Assignee: SGS-Thomson Microelectronics, S.r.l., Agrate Brianza, Italy

[21] Appl. No.: 456,097

[22] Filed: May 30, 1995

[30] Foreign Application Priority Data

May 31, 1994 [EP] European Pat. Off. ............ 94830264

[51] Int. Cl.$^6$ .................................................... G11C 7/00
[52] U.S. Cl. ............................... 365/189.09; 327/143
[58] Field of Search ................................. 327/143, 198, 327/142, 546; 365/189.09

[56] References Cited

U.S. PATENT DOCUMENTS

| | | | |
|---|---|---|---|
| 4,948,995 | 8/1990 | Takahaashi | 307/594 |
| 4,985,641 | 1/1991 | Nagayama et al. | 327/143 |
| 4,996,453 | 2/1991 | Zanders | 307/475 |
| 5,148,051 | 9/1992 | Deierling | 307/272.3 |
| 5,151,614 | 9/1992 | Yamazaki et al. | 327/143 |
| 5,166,545 | 11/1992 | Harrington | 307/272.3 |
| 5,349,244 | 9/1994 | Confalonieri | 327/143 |

FOREIGN PATENT DOCUMENTS

| | | |
|---|---|---|
| 0150480 | 8/1985 | European Pat. Off. |
| 0544380 | 6/1993 | European Pat. Off. |
| 2601832 | 1/1988 | France |

*Primary Examiner*—David C. Nelms
*Assistant Examiner*—Michael T. Tran
*Attorney, Agent, or Firm*—Robert Groover; Betty Formby; Matthew Anderson

[57] ABSTRACT

An initialization circuit for memory registers, having a signal input being applied a supply voltage which rises linearly from a null value, and an initializing output connected to an input of a memory register and on which a voltage signal, being equal or proportional to the supply voltage, during the initialization step, and a null voltage signal, upon the supply voltage dropping below a predetermined tripping value, are produced. Additionally, the circuit has, between the input and the output, a first circuit portion connected to the input; a second circuit portion connected after the first and having a first output connected to the initializing output; and a third, inverting circuit portion having an input connected to a second output of the second portion and an output connected to the first portion to hold off that first portion while the supply voltage drops below the threshold voltage.

23 Claims, 3 Drawing Sheets

LOW DISSIPATION INITIALIZATION CIRCUIT, PARTICULARLY FOR MEMORY REGISTERS

DESCRIPTION

1. Field of the Invention

This invention relates to a low dissipation initialization circuit particularly but not exclusively useful with memory registers.

Specifically, the invention relates to an initialization circuit for memory registers, being of the type which comprises a signal input having a supply voltage applied thereto which rises linearly from a zero value, and an initializing output connected to an input of a memory register and on which a voltage signal being equal or proportional to the supply voltage during the initializing stage and a null voltage signal upon the supply voltage dropping below a predetermined tripping value are produced, between said input and said output there being provided:

a first circuit portion connected to said input, and a second circuit portion connected after the first and having a first output connected to said initializing output.

2. Prior Art

As is well known, an appropriate configuration of many electronic circuits is dependent on receipt of an initialize or enable signal which, in combination with an appropriate power supply, will bring the circuit to a proper condition of operation.

The initialize signal can be generated by a purposely arranged circuit. An initialization circuit usually produces a signal which follows the rise of the supply voltage up to a predetermined value, to then drop back to a zero voltage upon this value being exceeded.

The threshold for this change is called the trip voltage Vs of the initialization circuit, and it is most important that the value of this tripping voltage Vs meets the specifications of the circuit to be driven to the on state.

The trip voltage Vs should at all times have such a value that all the circuits involved in the initialization are set correctly, and for integrated circuits of the MOS or CMOS type, this voltage Vs would also be tied to the thresholds of the individual transistors.

It should be further noted that most initialization circuits cut in automatically under circumstances where the supply voltage drops below the tripping voltage Vs and prevents circuit networks powered thereby from operating in their designed manner. Even when the supply voltage is restored to its steady state value, the circuit network would still have to be re-initialized.

However, for certain electronic devices, this operation may be counter-productive.

Taking circuit networks which make up so-called memory registers programmable by a microprocessor unit as an example, many registers require that their power-on configurations meet predetermined specifications, referred to as default values, which preset the circuit network for operation in its normal manner.

Consequently, the initialization circuit should be able to activate the memory register to its default state as provided for by the specifications.

It happens, however, that as the supply voltage attains its steady state value, the contents of the memory register may be altered, and should the supply voltage undergo significant surges at this point, for the reasons outlined above, the initialization circuit would re-configure the memory register to restore it to the default state.

Basically, what is beneficial to standard circuits to be initialized, would instead harm memory registers, for which restoration to the default state represents a standing error until the next writing of the register by the programming unit.

To make a practical example, consider that an elementary memory cell implemented in CMOS technology and operated on 5 volts can be arranged to hold a logic value stored in it at even very low supply voltage values below one volt. This capability is retained over a relatively long time and even on the occurrence of sharp drops in the supply voltage due to sudden and/or very short duration disturbance.

Thus, should the initialization circuit associated with the memory cut in under such conditions, the value contained therein would be lost, even though the memory by itself would have withstood the temporary disturbance quite comfortably.

An initialization circuit capable of obviating such a serious problem is disclosed in European Patent Application No. 0 544 380 by this Applicant.

FIG. 1 of the drawings appended hereto faithfully duplicates the main figure in that Application and shows a prior art initialization circuit for memory registers 2.

The circuit 1 has an input terminal I to which is applied a supply voltage Vp. The circuit also has a pair of terminals P1 and P2 which form initializing outputs.

That initializing circuit 1 allows for both conventional operation, by virtue of the output P1 even re-initializing the circuit networks connected thereto as the supply voltage drops below the threshold Vs, and operation in a suitable manner to initialize the memory registers through the output P2.

The evolution over time of the signal on the second output P2 holds the memory circuit programmed and only performs proper initialization when this is actually needed.

Although effective, this prior solution is not entirely devoid of shortcomings, to be found in other conventional initializing circuits as well.

A major shortcoming is that, after performing its set function, the circuit will continue to draw current on the supply Vp.

In the steady state condition, the circuit node A shown in FIG. 1 would indeed be at a voltage twice as high as the threshold voltage of an N-channel MOS transistor, while the circuit node B is at approximately the same voltage as the supply voltage Vp.

Consequently to this potential difference, a current is flowing through the resistors R1 and R2, contained in the first circuit portion 3, so that the resistors will dissipate power. Thus, power is even wasted while in the steady state condition.

Power consumption in the power-down condition should actually be as close to zero as possible, especially with those architectures which rely on low-power memory devices.

The problem of power consumption in the power-down condition is quite critical to architectures wherein the operative phase occupies a much smaller fraction of time than the power-down phase. An example of this type of apparatus is the cellular phone being kept in a standby state for most of the time.

Prior attempts to solve this consumption problem have been highly complicated, often bordering on technological unfeasibility.

Moreover, such prior approaches are not applicable to memory registers.

The underlying technical problem of this invention is to provide an initialization circuit, particularly for memory registers, which has such structural and functional features as to result in near-zero dissipation in steady state conditions, thereby overcoming the drawbacks of comparable circuits embodying the state of the art.

SUMMARY OF THE INVENTION

This technical problem is solved by a circuit as previously indicated and as defined in the characterizing clause of claim 1.

The features and advantages of a circuit according to the invention will be apparent from the following detailed description of an embodiment thereof, given by way of example and not of limitation with reference to the accompanying drawings.

DETAILED DESCRIPTION

Figure 1:
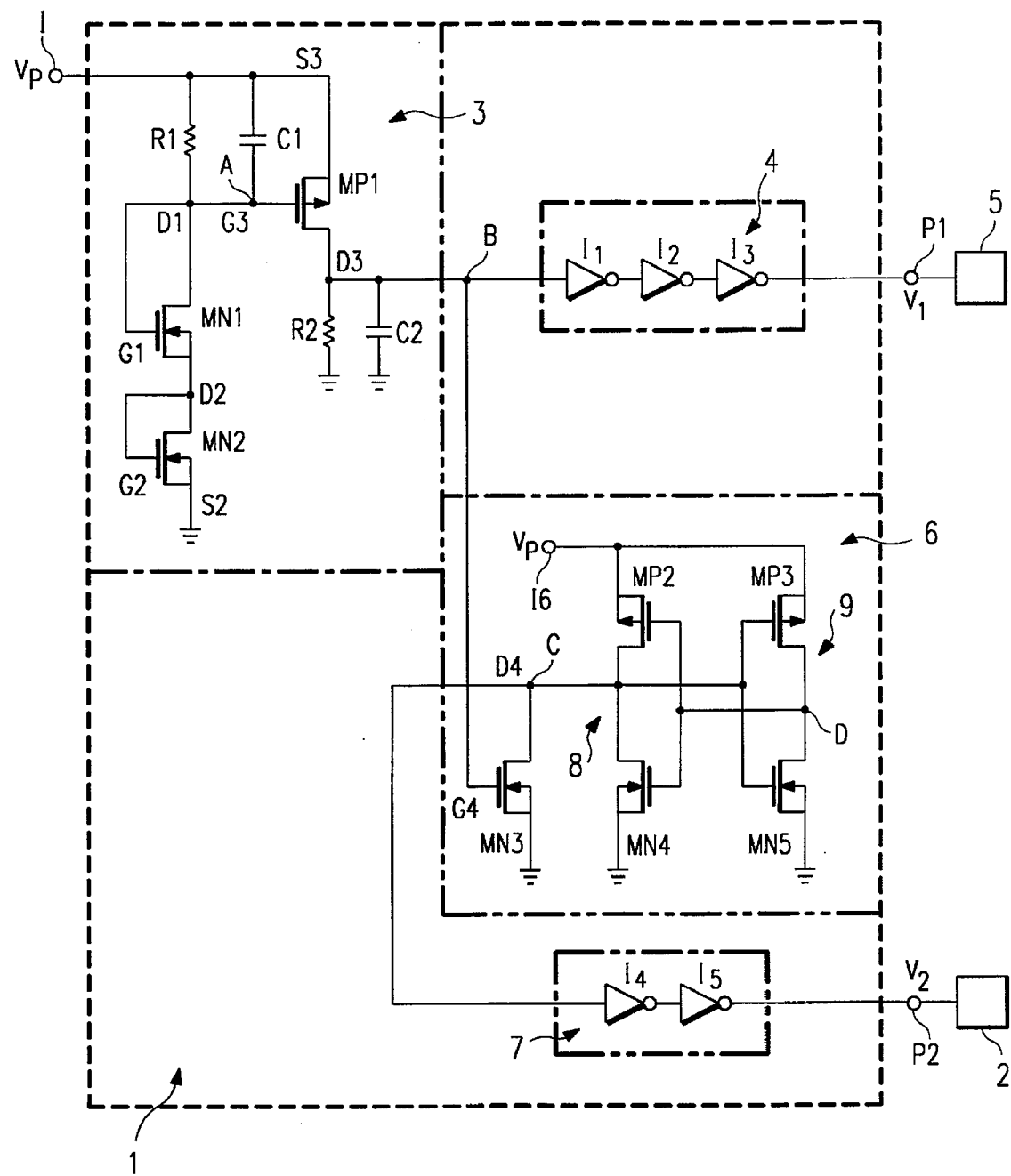
FIG. 1 is a diagram illustrating a prior art initialization circuit.
Figure 2:
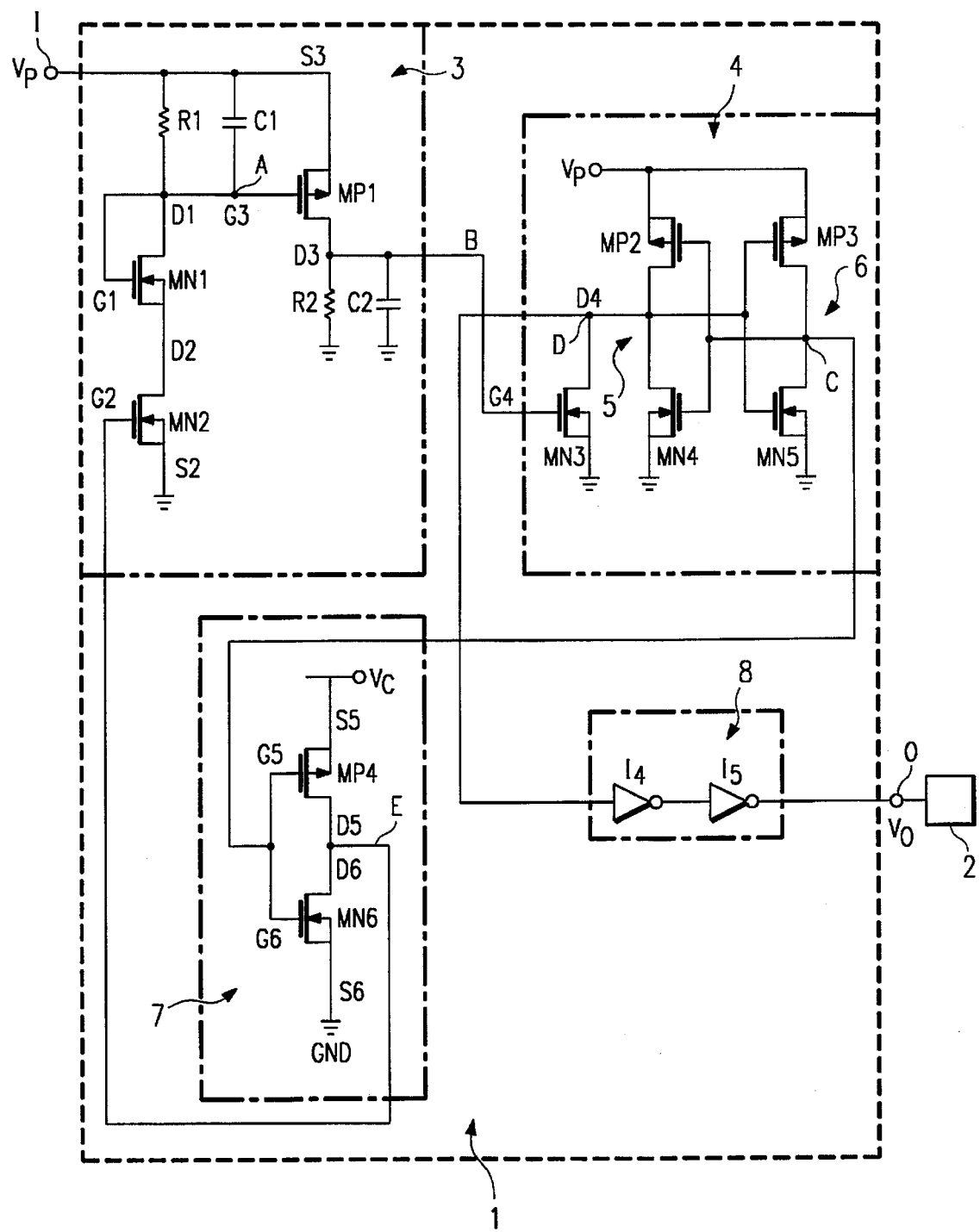
FIG. 2 shows in diagramatic form an initialization circuit embodying this invention.
Figure 3:
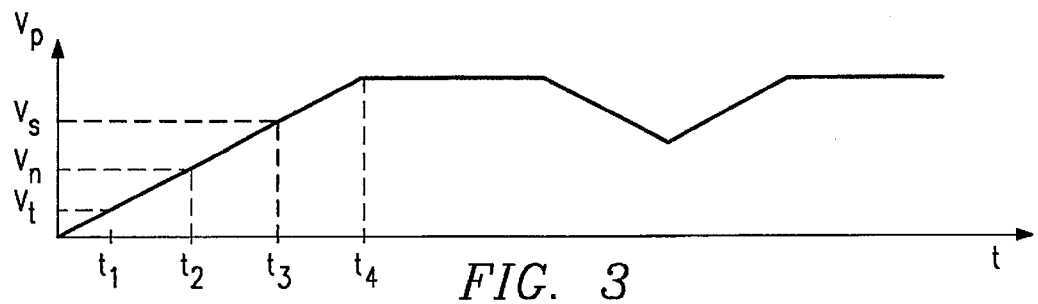
FIG. 3 illustrates graphically a waveform of a possible supply voltage to the circuit shown in FIG. 2.

With reference in particular to the example shown in FIG. 2, generally and schematically indicated at 1 is an initialization circuit which embodies this invention and is particularly, but not exclusively, useful with memory registers 2.

The circuit 1 has an input terminal I to which a supply voltage Vp is applied. The circuit 1 further comprises an initializing output terminal O connected to the memory register 2.

This circuit 1 comprises a first circuit portion 3 connected between the input terminal I and a voltage reference, e.g. a signal ground GND.

This first circuit portion 3 comprises a first, N-channel MOS transistor MN1, connected between a first circuit node A and a second turn-off transistor MN2. This first transistor MN1 has its gate terminal G1 connected to its corresponding drain terminal D1, basically in a diode configuration. The width W and length L of the channel region of the transistor MN1 are selected to provide a low impedance, e.g. at a ratio of W/L=100/4.

Advantageously, the second or turn-off transistor MN2 has its drain terminal D2 connected to the source of the first transistor MN1 and its source terminal connected to ground GND. This second transistor MN2 operates as a switch and has a relatively large size, thereby both providing a low impedance, similar to the first transistor MN1, and a low drain-to-source voltage drop. In the preferred embodiment described herein, the W/L ratio of MN2 is selected to be 100/0.8.

The drain terminal D1 of the first transistor MN1 is coincident with said node A, which is connected to the positive pole of the supply voltage Vp through an RC circuit comprising a parallel continuation of a resistor R1 and a capacitor C1. The node A is also connected to the gate terminal G3 of a third MOS transistor MP1 of the P-channel type which has its source terminal S3 connected to the positive pole of the supply voltage Vp and its drain terminal D3 connected to ground GND through a second RC circuit comprising a parallel of a resistor R2 and a capacitor C2. The width W and length L of the channel region of the transistor MP1 have also been selected to provide a low impedance.

The drain D3 of the transistor MP1 forms essentially the portion 3 output and is also referenced herein as circuit node B.

The second circuit node B is connected to a second circuit portion 4 which comprises further MOS transistors. Specifically, a first pair 5 of MOS transistors, MP2 and MN4, respectively of the P-channel and the N-channel type, are provided which are connected to each other into an inverter configuration.

A second pair 6 of transistors, MP3 and MN5, also connected into an inverter configuration, the former being a P-channel type and the latter an N-channel type, are connected in the second circuit portion 4 by a feedback cross connection to the first pair 5.

In essence, the gate terminals of the first pair 5 are connected to a node C forming a drain-to-drain contact point of the second pair 6. On the other hand, the gate terminals of the second pair 6 are connected to the drain-to-drain contact point of the first pair 5.

The size of the transistors in the second pair 6 is such that the P-channel is made much more resistive than the N-channel, thereby achieving a low tripping voltage for the inverter. Conversely, the first transistor pair 5 has the P-channel much more conductive than the N-channel, thereby conferring a high tripping voltage on the inverter.

The second circuit node B is also connected to the gate terminal G4 of a further MOS transistor MN3, of the N-channel type, which has its source S4 grounded. The portion 4 output forms a fourth circuit node D which is coincident with the drain D4 of the transistor MN3. The node D also coincides with the drain-to-drain contact point of the transistors MP2 and MN4 comprising the first pair 5.

A third, inverting circuit portion 7 is feedback connected between the second circuit portion 4 and the first circuit portion 3.

More specifically, an input of the inverting portion 7 is connected to the first output C of the second circuit portion 4, and an output of that portion 7, coincident with a further circuit node E, is connected to the first circuit portion 3, namely to the gate terminal of the transistor MN2.

The third circuit portion 7 comprises a series of two MOS transistors MP4 and MN6, respectively of the P-channel and the N-channel type, which are connected between a reference supply voltage $V_c$ and ground.

The MOS transistors MP4 and MN6 have their gate terminals G5 and G6 connected together and to the third circuit node C. In a similar manner, the drain terminals D5 and D6 are connected together to form the circuit node E.

The second MOS transistor MN2 contained in the first circuit portion 3 has its gate terminal G2 connected to the node E.

Finally, the circuit 1 includes a fourth circuit portion 8 which incorporates a pair of inverters I4, I5 in series with each other and is connected between the node D of the second circuit portion 4 and the output O. The voltage on the node D is substantially duplicated on the output O through the inverters I4 and I5.

In accordance with the invention, it is advantageously possible to substitute a different inverting circuit for the third inverting portion 7 without this altering the performance of the inventive circuit.

The operation of the circuit 1 according to the invention will now be described with reference to FIGS. 3 to 8 which illustrate, using the same time base, waveforms of voltage signals that appear in this circuit.

Figure 4:
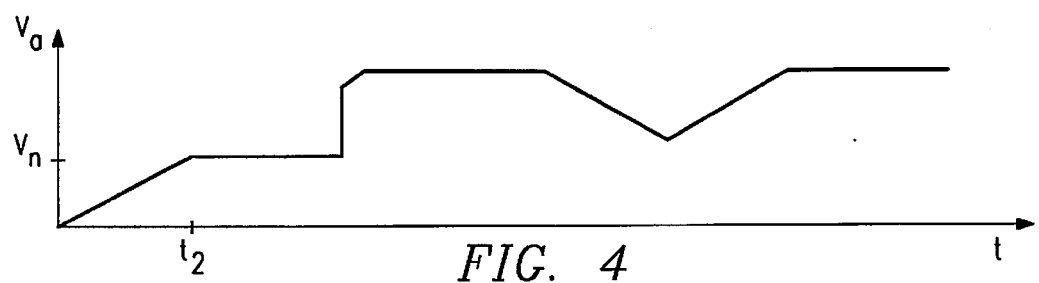
FIGS. 4 to 8 are graphs illustrating voltage waveforms having the same time base and appearing in the circuit of FIG. 2.
Figure 5:
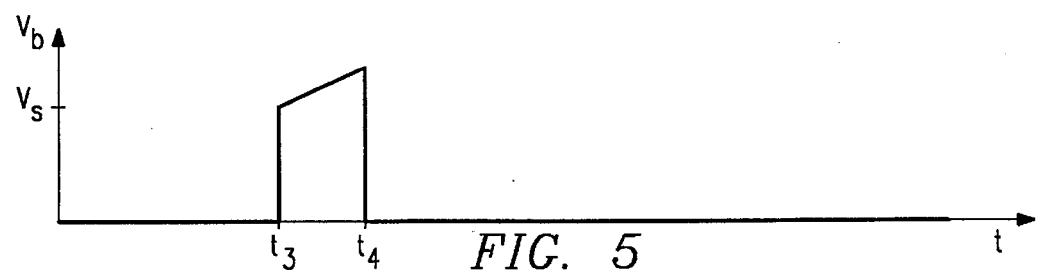

As the supply voltage Vp rises toward its steady state value (FIG. 3), the voltage Va at the node A also rises until it reaches, at a time t2, a value equalling the threshold voltage Vt of the N-channel transistor MN1 (see FIG. 4).

The resistance R1 being quite high, with a further small voltage increase δN, the node A is stabilized at a voltage value Vn=Vt+δN even while the supply Vp keeps rising.

The second transistor MP1 will be held off until the voltage across the pole Vp and the gate G3 attains the conduction threshold Vh of that P-channel transistor; at this point, a voltage increase δP, however small, will be sufficient to confer a negligible impedance on the P channel of the third transistor MP1 compared to that of the resistor R2, thereby driving the node B to the same value as the supply voltage Vp. Thus, before the supply voltage Vp reaches the tripping threshold Vs, as given by the following equation $$Vs=Vn+Vh+\delta P=Vtn-ch+\delta N+Vhp-ch+\delta P$$

the voltage at the node B will be null.

It is important to note that a null voltage value is already present on the output C of the second circuit portion 4 at the time t1: consequently, the voltage value Vp will be present on the gate terminal G2 of the transistor MN2, and the voltage drop between the drain D2 and ground GDN will be substantially negligible. The presence of the capacitors C1 and C2 provides the circuit 1 with a capability to respond promptly to upward surges in the power supply.

The evolution of the other nodes, C and D, of the circuit 1, will now be discussed.

Figure 6:
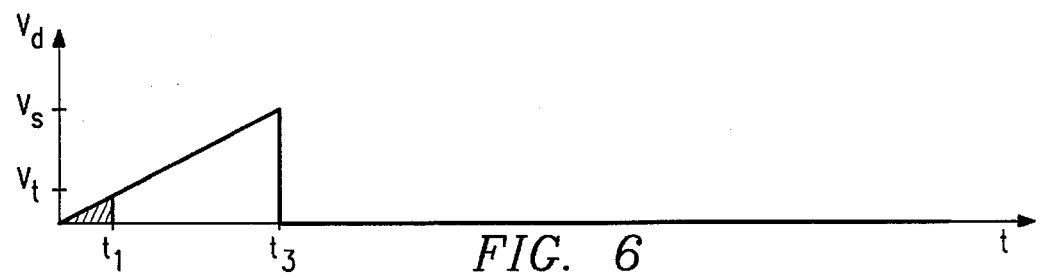
Figure 7:
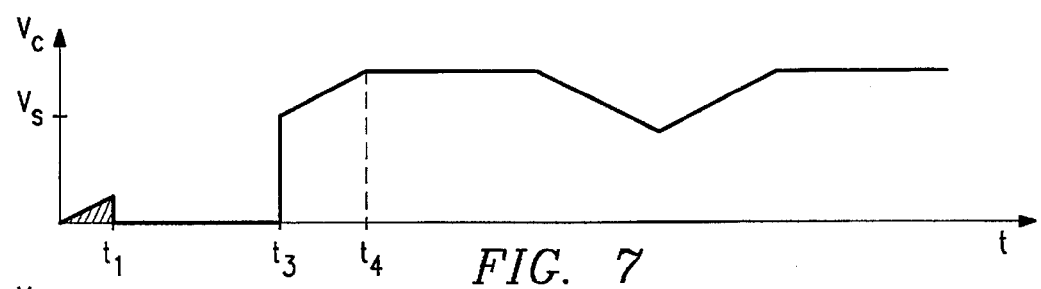
Figure 8:
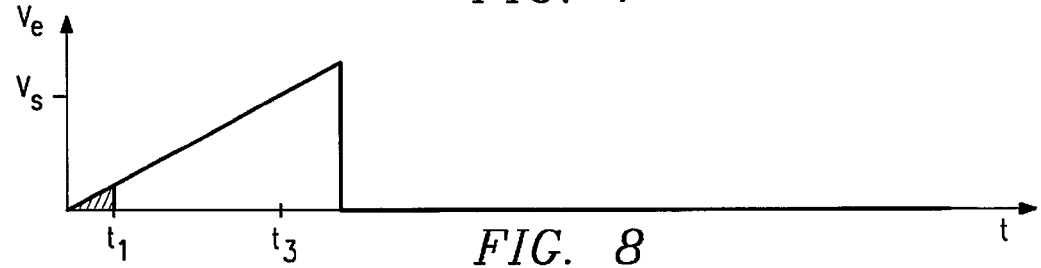

As previously mentioned, the inverter pairs 5 and 6 are unbalanced because their tripping voltages are different from each other. This means that the feedback connection of these inverters 5 and 6 will prevent the nodes C and D from attaining the same voltage value by the end of the transient. That is, the circuit will evolve, from a starting state where both nodes are at null voltage, to bring the node D to the same potential Vp as the power supply and the node C to ground (FIGS. 6 and 7).

The unbalance of the inverters 5 and 6 is bound to stay until the fourth transistor MN3 is made to conduct. which will occur at the time t3 upon the voltage Vb on the second node B reaching the tripping value Vs.

Under such conditions, the voltage on the node B will attain the same value as the supply voltage Vp, pulling the voltage on the node D to ground. With the node D voltage to ground, the voltage on the node C will rise to the supply voltage Vp, pulling the node E to ground. Thereupon, the transistor MN2 will go off (i.e., enter the non-conduction region), and the voltage Va on the node A rise to also put off the transistor MP1.

Thus, the voltage Vb on the node B is brought back to zero following its stay at the supply voltage Vp. In fact, the node B is to remain at the voltage Vp for a sufficient time to cause the zeroing of the voltage Vd of the node D to permit the node C to be actually switched to the value of Vp. In this way, the elevated voltage on the node C will further drive the node D to the null ground value, and any subsequent restoration of the node B to a zero value would under no circumstances cause the voltage on the node D to rise again and, consequently, trigger an oscillation. Thus, even if the node B is restored to a null voltage value, the node D would be held grounded. To achieve this, it will suffice that the parameters of the second circuit portion 4 be suitably sized, after the values of the circuit elements present in the portion 3 have been set.

Thus, the initialization circuit of this invention allows the voltage Va of the node A to be set at the supply voltage Vp, and the voltage Vb of the node B to be set at a zero value, thereby preventing current from flowing through the resistors and reducing power consumption virtually to zero, The circuit, therefore, has no power consumption in the standby condition.

This initialization circuit 1 is only re-activated upon the supply voltage Vp being removed and then re-applied. In these circumstances, the voltages Vd and Vc on the nodes D and C would, in fact, be restored to the value of the supply voltage Vp and to zero, respectively.

Advantageously, the provision of the resistors R1 and R2 in the circuit 1 causes the voltage on the second node B to remain actually null up to a time t3 when the power supply attains the tripping threshold Vs.

The evolution over time of the signal on the output O holds the memory circuits programmed and only effects the appropriate initialization when actually needed.

The circuit of this invention may be implemented in an integrated form, in which case the resistors R1 and R2 could be formed in so-called N-wells and P-wells beneath the layers of any metallization paths, thereby avoiding waste of occupied area.

What is claimed is:

1. An initialization circuit for memory registers, being of the type which comprises a signal input being applied a supply voltage which rises linearly from a null value, and an initializing output connected to an input of a memory register and on which a voltage signal being equal or proportional to the supply voltage, during the initialization step, and a null voltage signal, upon the supply voltage dropping below a predetermined tripping value, are produced, between said input and said output there being provided:

a first circuit portion connected to said input, a second circuit portion connected to an output of the first circuit portion and having a first output connected to said initializing output, and a third, inverting circuit portion having an input connected to a second output of the second portion and an output connected to said first portion to even hold off that first portion while the supply voltage drops below said threshold voltage.

2. A circuit according to claim 1, characterized in that a turn-off transistor acting on said first portion is connected between the output of the third, inverting circuit portion and said first portion.

3. A circuit according to claim 1, characterized in that said third, inverting circuit portion comprises at least a complementary pair of MOS transistors.

4. A circuit according to claim 3, characterized in that the gate terminals of said pair of MOS transistors are connected together and to the first output of the second circuit portion.

5. A circuit according to claim 3, characterized in that said transistors have respective drain terminals connected to form said output of the third circuit portion.

6. A circuit according to claim 3, characterized in that said transistors are connected together and between the positive pole of the supply voltage and a ground voltage reference.

7. A circuit according to claim 3, characterized in that a first of said transistors is a P-channel MOS type, and the second of said transistors is an N-channel MOS type.

8. A circuit according to claim 2, characterized in that said turn-off transistor is connected, serially with at least one diode, in a circuit leg of said first portion (3).

9. A circuit according to claim 2, characterized in that said turn-off transistor is a MOS type and a relatively large size to provide a low impedance and negligible drain-to-source voltage drop.

10. A memory initialization circuit, comprising:

a first circuit portion connected to provide an output which goes active when the power supply rises above an acceptable minimum value;

a second circuit portion connected to receive said output of said first circuit, and to track said power supply voltage, and to accordingly provide a first output which is operatively connected to hold said memory active thereafter, and a second output which is operatively connected to cut off static current flow in said first circuit portion and to hold the output of said first circuit portion active even if the power supply voltage thereafter temporarily dips below said acceptable minimum value.

11. The circuit of claim 10, wherein said first output of said second circuit is followed by a chain of inverters.

12. The circuit of claim 10, wherein said second output of said second circuit is followed by a single inverter.

13. The circuit of claim 10, wherein said acceptable minimum value is defined by a subcircuit which includes at least one diode-connected field-effect transistor.

14. The circuit of claim 10, wherein said acceptable minimum value is defined by a subcircuit which includes at least one diode-connected field-effect transistor.

15. An integrated circuit comprising:

a memory register, and an initialization circuit which is connected to control initialization of the memory register, and which comprises:

a first circuit portion connected to provide an output which goes active when the power supply rises above an acceptable minimum value;

a second circuit portion connected to receive said output of said first circuit, and to track said power supply voltage, and to accordingly provide a first output which is operatively connected to hold said memory active thereafter, and a second output which is operatively connected to cut off static current flow in said first circuit portion and to hold the output of said first circuit portion active even if the power supply voltage thereafter temporarily dips below said acceptable minimum value.

16. The circuit of claim 15, wherein said first output of said second circuit is followed by a chain of inverters.

17. The circuit of claim 15, wherein said second output of said second circuit is followed by a single inverter.

18. The circuit of claim 15, wherein said acceptable minimum value is defined by a subcircuit which includes at least one diode-connected field-effect transistor.

19. The circuit of claim 15, wherein said acceptable minimum value is defined by a subcircuit which includes at least one diode-connected field-effect transistor.

20. A memory initialization circuit comprising:

a first circuit portion comprising voltage-reference elements configured to drive an output node active when a magnitude of voltage on a power supply input exceeds a predetermined minimum threshold value;

a second circuit, comprising an asymmetrical CMOS latch, which is operatively connected to be driven by said output of said first circuit portion, and to provide first and second complementary outputs accordingly, said first output of said second circuit being operatively connected to provide an enable signal to one or more memory registers, and said second output of said second circuit being operatively connected to drive an inverter whose output is operatively connected to drive a pass transistor which blocks current passage through at least one said voltage reference element whenever said first output of said second circuit goes active.

21. The circuit of claim 20, wherein said first output of said second circuit is followed by a chain of inverters.

22. The circuit of claim 20, wherein said second output of said second circuit is followed by a single inverter.

23. The circuit of claim 21, wherein said reference elements include at least one diode-connected field-effect transistor.

* * * * *